(12) United States Patent
Koide

(10) Patent No.: US 7,646,623 B2
(45) Date of Patent: Jan. 12, 2010

(54) FERROELECTRIC MEMORY DEVICE AND ELECTRONIC APPARATUS

(75) Inventor: Yasunori Koide, Matsumoto (JP)

(73) Assignee: Seiko Epson Corporation (JP)

( * ) Notice: Subject to any disclaimer, the term of this patent is extended or adjusted under 35 U.S.C. 154(b) by 211 days.

(21) Appl. No.: 11/608,391

(22) Filed: Dec. 8, 2006

(65) Prior Publication Data

US 2007/0133328 A1  Jun. 14, 2007

(30) Foreign Application Priority Data

Dec. 9, 2005  (JP) .............................. 2005-356944

(51) Int. Cl.
  *G11C 11/22* (2006.01)
(52) U.S. Cl. ...................... 365/145; 365/65; 365/210.1; 365/185.2
(58) Field of Classification Search ................. 365/145, 365/65, 117, 210, 203, 205, 207, 185.2, 210.1; 327/50–57; 361/321.11; 349/37, 49; 369/126
See application file for complete search history.

(56) References Cited

U.S. PATENT DOCUMENTS

| 4,972,378 | A | * | 11/1990 | Kitagawa et al. | ........ 365/185.11 |
| 5,299,165 | A | * | 3/1994 | Kimura et al. | .............. 365/207 |
| 5,903,492 | A | * | 5/1999 | Takashima | .................... 365/145 |
| 5,943,256 | A | * | 8/1999 | Shimizu et al. | ............. 365/145 |
| 6,198,334 | B1 | * | 3/2001 | Tomobe et al. | ............... 327/391 |
| 6,611,015 | B2 | | 8/2003 | Ozaki et al. | |
| 6,916,677 | B2 | * | 7/2005 | Nakajima et al. | ............. 438/57 |
| 6,943,398 | B2 | | 9/2005 | Ito et al. | |
| 7,022,531 | B2 | | 4/2006 | Ozaki et al. | |
| 7,288,456 | B2 | | 10/2007 | Ito et al. | |
| 7,550,344 | B2 | | 6/2009 | Ito et al. | |
| 2003/0169616 | A1 | * | 9/2003 | Noro | ........................ 365/145 |
| 2003/0214002 | A1 | * | 11/2003 | Chow et al. | ................. 257/411 |
| 2003/0235070 | A1 | * | 12/2003 | Ooishi | ........................ 365/158 |

FOREIGN PATENT DOCUMENTS

| JP | 2002-094022 | 3/2002 |
| JP | 2005-129903 | 5/2005 |

OTHER PUBLICATIONS

A Survey of Circuit Innovations in Ferroelectric Random-Access Memories, A. Sheikholeslami, et al.,Proceedings of the IEEE, vol. 88, No. 5, May 2000, pp. 667-689.*
New Development of Ferroelectric Memory, CMC Publication, p. 3.

* cited by examiner

*Primary Examiner*—Richard Elms
*Assistant Examiner*—Harry W Byrne
(74) *Attorney, Agent, or Firm*—Harness, Dickey & Pierce, P.L.C.

(57) ABSTRACT

A ferroelectric memory device includes: a memory cell having a transistor and a ferroelectric capacitor connected in series between a bit line and a plate line, and a connecting section below the ferroelectric capacitor; a dummy cell having a transistor, a ferroelectric capacitor and a connecting section, wherein the dummy cell has an electrically disconnected section among the bit line, the transistor, the ferroelectric capacitor, the connecting section and the plate line.

7 Claims, 13 Drawing Sheets

FERROELECTRIC MEMORY DEVICE AND ELECTRONIC APPARATUS

The entire disclosure of Japanese Patent Application No. 2005-356944, filed Dec. 9, 2005 is expressly incorporated by reference herein.

BACKGROUND

1. Technical Field

The present invention relates to ferroelectric memory devices and electronic apparatuses equipped with the ferroelectric memory devices.

2. Related Art

Ferroelectric memories (or Ferroelectric Random Access Memory (FeRAM)) store data, using hysteresis characteristics occurring between polarization of ferroelectric material and electric fields, and are attracting attention because of their high-speed performance, low power consumption and non-volatile property.

Each of ferroelectric memories composing a memory cell array may be formed from a ferroelectric capacitor and a transistor, wherein one end of the ferroelectric capacitor is connected to a plate line, and the other end is connected to a bit line through the transistor.

The memory cell having the structure described above may have a structure in which plugs are formed on source and drain regions of the transistor for connection to the ferroelectric capacitor and bit line. An example of related art is described in a non-patent document titled "New Development of Ferroelectric Memory" by CMC Publication on page 3.

The inventors of the present application have been in research and development of ferroelectric memory devices, and in keen examination to improve the device characteristics.

During such research and development, it has become clear that defects would likely occur in outer circumferential sections of memory cell arrays in the devices. Such defects are believed to occur because pattern density concentration and dispersion would likely occur in outer circumferential sections of memory cell arrays.

As one of the solutions to such defects, a method of disposing dummy cells (dummy transistors and dummy capacitors) in an outer circumferential area of memory cell arrays may be used. By disposing dummy cells that do not function as memory cells, the regular cell arrangement of the memory cell composing section can be secured, and the memory cell configuration can be secured, even in the outermost circumferential area of the memory cell arrays.

However, when dummy capacitors are connected to plate lines, the load on the plate lines becomes greater. Accordingly, to reduce the load, structures in which plate lines and dummy capacitors are not connected have been considered.

However, even when such a structure is adopted, it became clear that defects occurred in the outermost circumferential areas of the memory cell arrays, although the defect rate was lowered. It turned out that, because connection sections (contact sections, plugs) are not formed below (immediately below) the capacitors in the dummy cell area, the configuration of the memory cell array is not secured in the outermost circumferential area of the memory cell array, and roughness is formed in the ferroelectric films over the outermost circumferential area. This problem will be described below in greater detail.

In ferroelectric memory devices whose memory capacity is greatly affected by the orientation of ferroelectric films, the roughness formed in the films deteriorates the orientation of the films, which in turn deteriorates the memory characteristics.

In order to avoid such deficiencies, it may be possible to secure for the configuration of the connection section described above by making the dummy cells to have the same structure as that of the memory cells. However, in this case, the capacitance of the dummy capacitances described above becomes to be an additional load, which lowers the operation speed.

SUMMARY

In accordance with an advantage of some aspects of the present invention, the characteristics of a ferroelectric memory device can be improved. In accordance with another aspect of the present invention, the configuration of each component of memory cells can be secured by providing dummy cells having a novel structure. Also, by providing dummy cells with a novel structure, ferroelectric memory devices capable of high speed operation even with the dummy cells can be provided.

The advantages described above can be achieved by combinations of features recited in independent claims, and dependent claims further define advantageous exemplary embodiments of the invention.

(1) A ferroelectric memory device in accordance with an embodiment of the invention includes: (a) a memory cell having a transistor and a ferroelectric capacitor connected in series between a bit line and a plate line, and a connecting section below the ferroelectric capacitor; (b) a dummy cell having a transistor, a ferroelectric capacitor and a connecting section, wherein the dummy cell has an electrically disconnected section among the bit line, the transistor, the ferroelectric capacitor, the connecting section and the plate line.

In this manner, because the electrically disconnected section is provided between the bit line and the plate line in the dummy cell, the load on the bit line and the plate line is reduced, and the operation speed can be improved.

Further, because the connecting section below the ferroelectric capacitor is also provided in the dummy cell, the configuration of the connecting section can be secured in the memory cell. As a result, the flatness of the ferroelectric capacitor formed above the connecting section, in particular, the flatness of ferroelectric films composing the ferroelectric capacitor can be secured, and the orientation of the films can be made excellent. Accordingly, the memory characteristics can be improved.

It is noted that the "electrically disconnected section among the bit line, the transistor, the ferroelectric capacitor, the connecting section and the plate line" means not only, for example, a case in which a connecting section that connects components is not formed, but also a case in which source and drain regions composing a transistor are not connected to another component or to a channel region (a portion below a gate electrode) of the transistor.

(2) A ferroelectric memory device in accordance with another embodiment of the invention includes: (a) a memory cell having a transistor and a ferroelectric capacitor connected in series between a bit line and a plate line, and a connecting section below the ferroelectric capacitor; (b) a dummy cell having a pseudo transistor and a ferroelectric capacitor connected in series between a bit line and a plate line, and a connecting section below the ferroelectric capacitor, wherein the pseudo transistor has a gate electrode that does not turn on when a potential is applied to the gate electrode.

Because the dummy cell is provided with the pseudo transistor, the pseudo transistor is not turned on, and therefore is not connected to the bit line or the plate line even, when a potential is applied to the gate electrode. Therefore, the load on these wirings is lowered, and the operation speed is improved. Also, because the dummy transistor does not turn on, the load on the word line (gate electrode) can be lowered, and the operation speed can be improved.

It is noted that the "pseudo transistor" includes a transistor that lacks one or more of its components, such as, a gate electrode, a gate dielectric film, a source, and a drain region, or has deformation of one or more of its components. The deformation of a component of the pseudo transistor includes cases where the forming section of the source or drain region is made anomalous, the film thickness of the gate dielectric film is thicker, and the like.

(3) A ferroelectric memory device in accordance with another embodiment of the invention includes: a first cell; and a second cell, wherein (a) the first cell includes (a1) a gate electrode formed on a substrate, (a2) first and second diffusion layers formed in the substrate on both sides of the gate electrode, (a3) a connecting section formed on the first diffusion layer, and (a4) a ferroelectric capacitor formed on the connecting section; and (b) the second cell includes a gate electrode formed on a substrate, first and second diffusion layers formed in the substrate on both sides of the gate electrode, a connecting section formed on the first diffusion layer, and a ferroelectric capacitor, wherein (b1) the gate electrode of the second cell is separated from an end section of the first diffusion layer of the second cell adjacent to the gate electrode.

In this manner, because, in the second cell, the gate electrode is separated from the first diffusion layer, this section is placed in a floating state, even when a potential is applied to the bit line or the plate line, such that the load on the bit line or the plate line is reduced, and the operation speed is improved. Also, the transistor at the second cell does not turn on, such that the load on the word line (gate electrode) can be reduced, and the operation speed can be improved.

Also, because the dummy cell is also provided with the connecting section below the ferroelectric capacitor, the configuration of the memory cell can be secured. As a result, the flatness of the ferroelectric capacitor formed above the connecting section, in particular, the flatness of ferroelectric films composing the ferroelectric capacitor can be secured, and the orientation of the films can be made excellent. Accordingly, the memory characteristics can be improved.

In accordance with an aspect of the embodiment of the invention, the gate electrode may preferably be separated from an end section of the second diffusion layer on the side of the gate electrode.

In accordance with an aspect of the embodiment of the invention, a second dielectric film may preferably be provided below the gate electrode of the second cell, the second dielectric film having a greater thickness than that of the first dielectric film below the gate electrode of the first cell.

In accordance with an aspect of the embodiment of the invention a second dielectric film may preferably be formed wider than the gate electrode of the second cell.

In accordance with an aspect of the embodiment of the invention, another connecting section may preferably be provided above the ferroelectric capacitor.

In accordance with an aspect of the embodiment of the invention, the first cell and the second cell may preferably be formed in a memory region, wherein the second cell is located more outside than the first cell.

In accordance with an aspect of the embodiment of the invention, the first cells may preferably be disposed in an array, and the second cells are disposed in an outer circumference of the plurality of the first cells, or among the plurality of the first cells.

(4) An electric apparatus in accordance with an embodiment of the invention includes the ferroelectric memory device described above. It is noted that the "electronic apparatus" refers to any one of apparatuses in general, each equipped with the ferroelectric memory device in accordance with any of the embodiments of the invention, and performing a specified function. The "electronic apparatus" is not limited to any particular structure, and includes any apparatuses that require memory devices, such as, for example, computer apparatuses in general equipped with the ferroelectric memory devices, cellular phones, PHS, PDA, electronic notebooks, IC cards, etc.

DESCRIPTION OF EXEMPLARY EMBODIMENTS

Preferred embodiments of the invention are described in detail below with reference to the accompanying drawings. It is noted that components having the same function are appended with the same or similar reference numbers, and description of the same components is not repeated.

First, a block structure of a ferroelectric memory device (i.e., a ferroelectric memory, a semiconductor memory device) in accordance with an embodiment of the invention is described.

Figure 1:
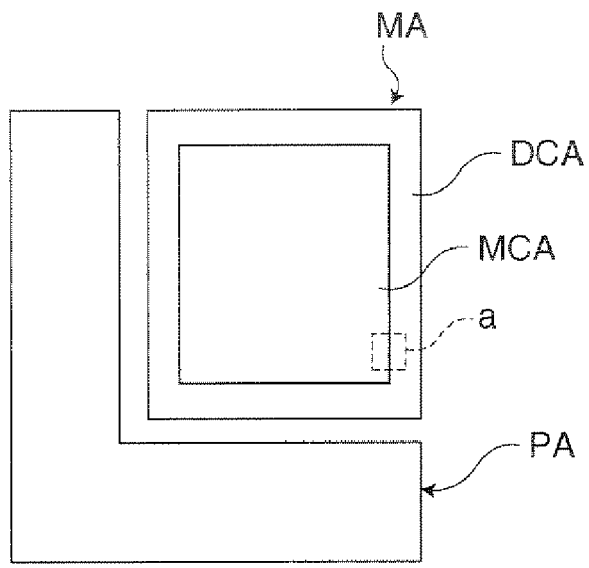
FIG. 1 is a block diagram showing a structure of a ferroelectric memory device in accordance with an embodiment of the invention.

FIG. 1 is a block diagram of a ferroelectric memory device in accordance with the embodiment of the invention. As illustrated, the ferroelectric memory device includes a memory cell array (i.e., a memory cell region, a memory cell section) MCA, a dummy cell area (i.e., a dummy cell region, a dummy cell section) DCA located in an outer circumference area of the MCA, and a peripheral circuit area PA. It is noted that the memory cell array MCA and the dummy cell area DCA located in the outer circumferential area of the memory cell array MCA are jointly called a memory cell area MA.

Figure 2:
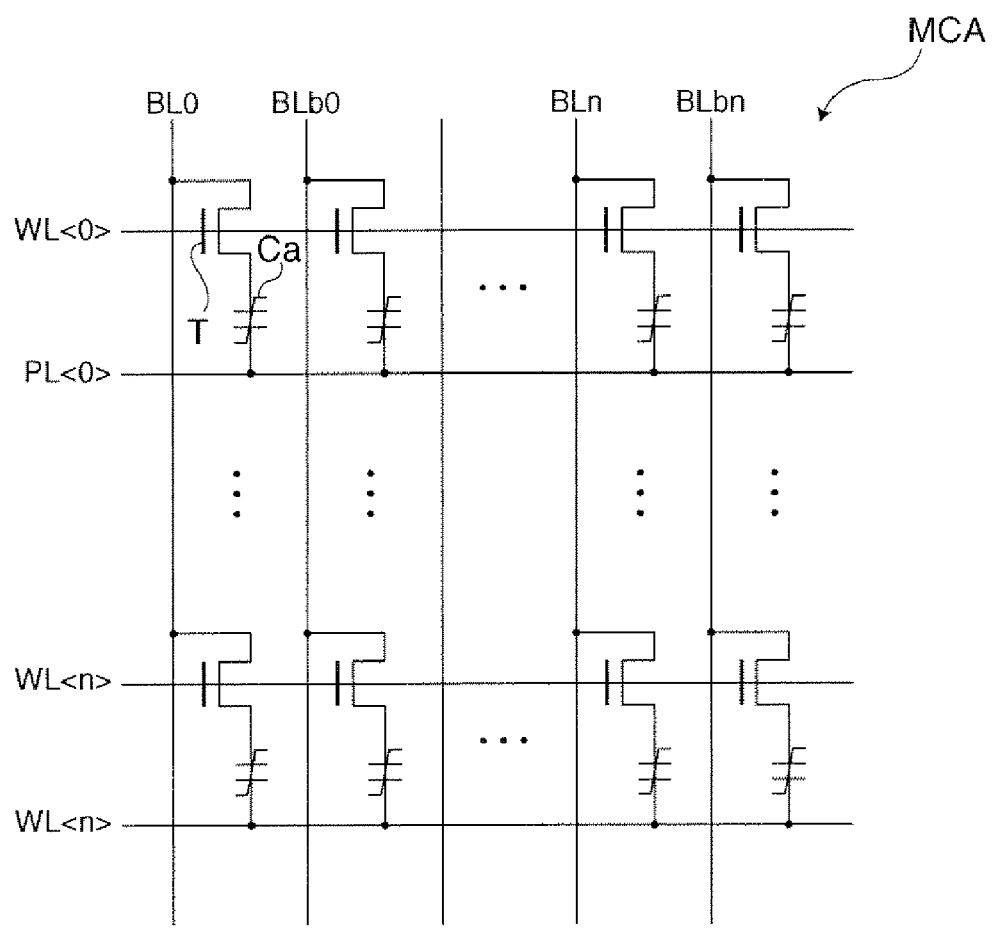
FIG. 2 is a circuit diagram of an example of a memory cell array.

FIG. 2 is a circuit diagram of an example of the structure of the memory cell array MCA. As illustrate, the memory cell array MCA includes word lines WL0-WLn and plate lines PL0-PLn extending in a first direction, and bit lines (bit line pairs) BL0-BLn and BLb0-BLbn extending in a second direction. Memory cells are disposed at intersections between the word lines WL (plate lines PL) and the bit lines BL and BLb.

More specifically, in the memory cell array MCA, a plurality of memory cells, each composed of a ferroelectric capacitor Ca and a transistor (for example, an n-channel type MISFET (metal insulator semiconductor field effect transistor)) T, are disposed in an array configuration. One ends of the ferroelectric capacitors (i.e., capacitors, capacitor sections) Ca are connected to the bit lines BL or BLb through the transistors T, and the other ends are connected to the plate lines PL. Furthermore, gate electrodes (gate wirings) of the transistors T define the word lines WL.

The ferroelectric capacitor Ca stores predetermined data based on a voltage difference between one end and the other end thereof and discharges a predetermined amount of charge based on the stored data to the bit line BL, BLb.

Next, referring to FIG. 3 through FIG. 10, the structure of the ferroelectric memory device in accordance with the embodiment of the invention is described in greater detail. FIG. 3 through FIG. 10 are cross-sectional views showing the steps of a method for manufacturing a ferroelectric memory device in accordance with the present embodiment and plan views of main portions of the ferroelectric memory device. The cross-sectional views shown in FIG. 3, FIG. 5, FIG. 7 and FIG. 9 correspond to cross sections taken along a line A-A' and a line B-B' in the plan views shown in FIG. 4, FIG. 6, FIG. 8 and FIG. 10, respectively. Also, each of the plan views corresponds to a region a in FIG. 1.

First, a structure of the ferroelectric memory device in accordance with the embodiment of the invention is described. It is noted that, first, characteristic features of the ferroelectric memory device of the present embodiment are described, and details of the structure of the ferroelectric memory device shall become clearer in conjunction with a method for manufacturing the ferroelectric memory device to be described below.

Figure 9:
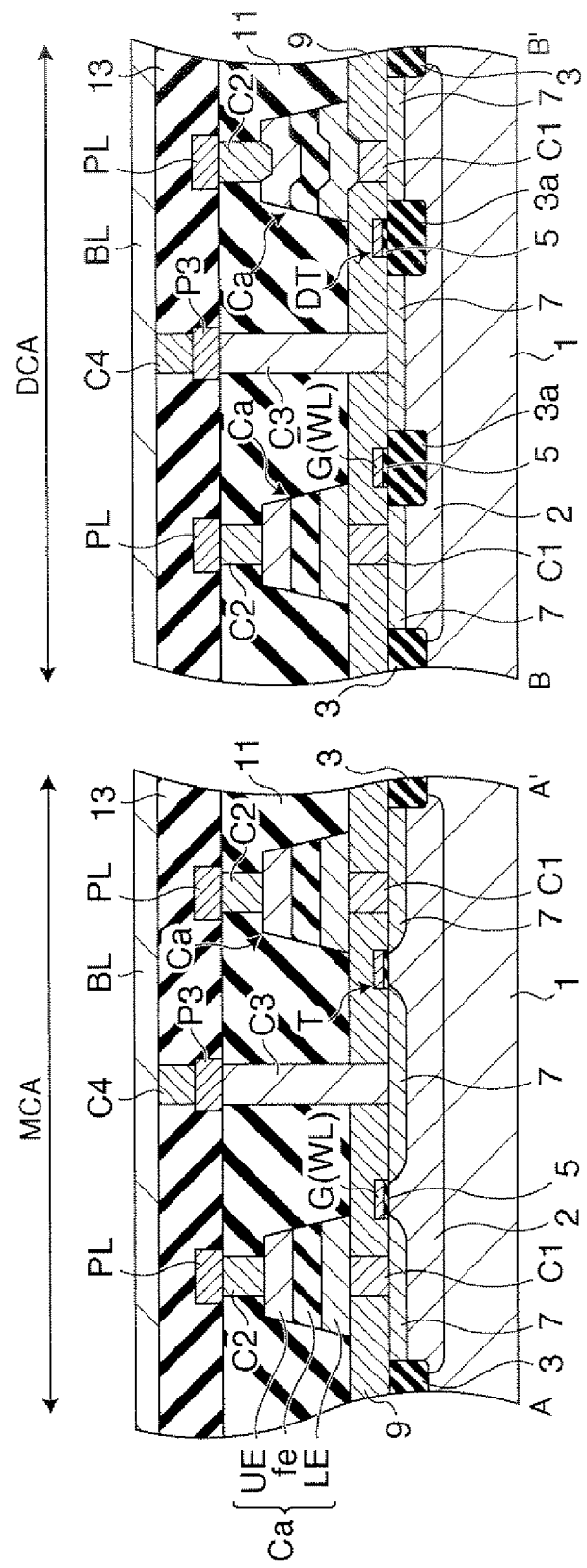
FIG. 9 is a cross-sectional view showing a step of the method for manufacturing a ferroelectric memory device in accordance with the embodiment of the invention.
Figure 10:
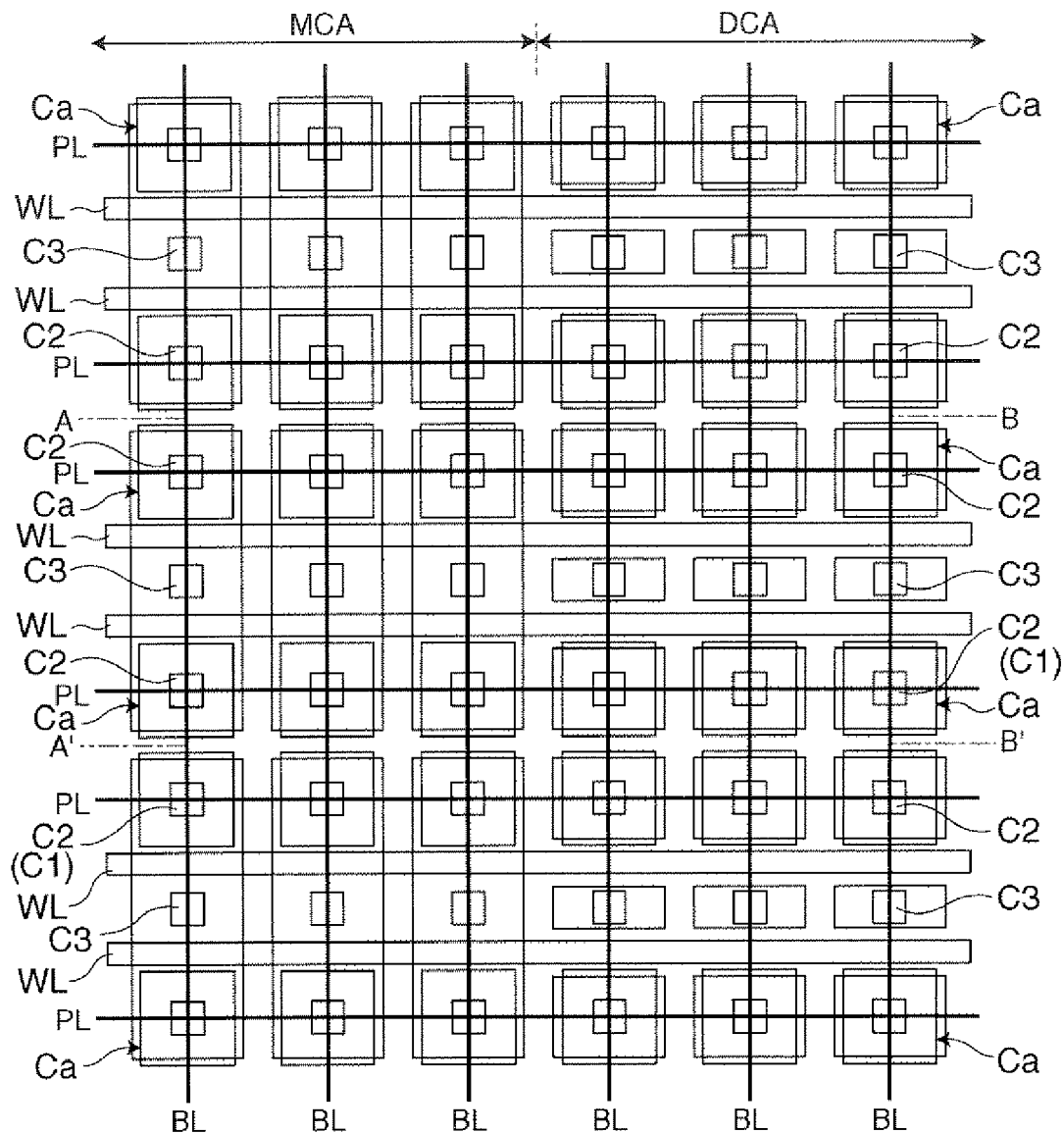
FIG. 10 is a plan view showing a specified portion in a step of the method for manufacturing a ferroelectric memory device in accordance with the embodiment of the invention.

As illustrated in FIG. 9 and FIG. 10, which are views showing the final step, in the memory cell area MCA of a semiconductor substrate (substrate) 1, transistors T and ferroelectric capacitors Ca composing the memory cells are formed. Each of the transistors T is composed of a gate dielectric film 5 formed on the substrate 1, a gate electrode (a gate wiring, a word line WL) G and source/drain regions 7 on both sides of the gate electrode G. Also, each of the ferroelectric capacitors Ca is composed of a lower electrode LE, a ferroelectric film fe, and an upper electrode UE.

One of the source and drain regions 7 (one end) of the transistor T is connected to the bit line BL through a connecting section (i.e., a plug, a contact, a via) C3, a pattern P3 and a connecting section C4, provided above the transistor T. The other of the source and drain regions 7 (the other end) of the transistor T is connected to the lower electrode LE of the ferroelectric capacitor Ca through a connecting section C1 provided above the transistor T. Also, the upper electrode UE of the ferroelectric capacitor Ca is connected to the plate line PL through a connecting section C2 provided above the ferroelectric capacitor Ca.

On the other hand, in the dummy cell area DCA on the substrate 1, dummy cell transistors (pseudo transistors) DT and ferroelectric capacitors Ca composing dummy cells are formed. Each of the dummy cell transistors DT includes a gate dielectric film 5 formed on the substrate 1, a gate electrode G, and source/drain regions (i.e., diffusion layers, semiconductor regions) 7 in the substrate on both sides of the gate electrode G. However, end sections of the gate electrode G and end sections of the source/drain regions 7 are separated from one another by a predetermined distance (see D1 in FIG. 5 and FIG. 6), respectively.

Also, an isolation dielectric film 3 is formed below the gate electrode G of the dummy transistor DT. Accordingly, the dielectric film (3a) below the gate electrode G of the dummy transistor DT is substantially larger than the gate dielectric film 5 of the memory cell.

Figure 5:
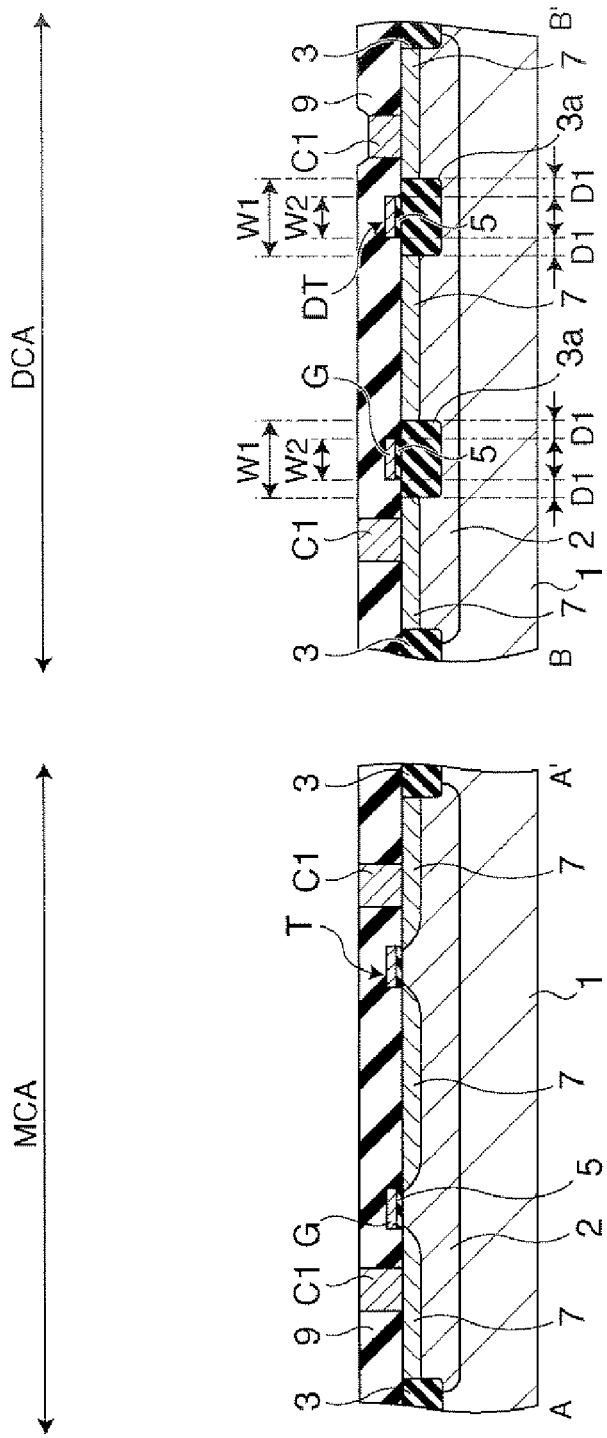
FIG. 5 is a cross-sectional view showing a step of the method for manufacturing a ferroelectric memory device in accordance with the embodiment of the invention.
Figure 6:
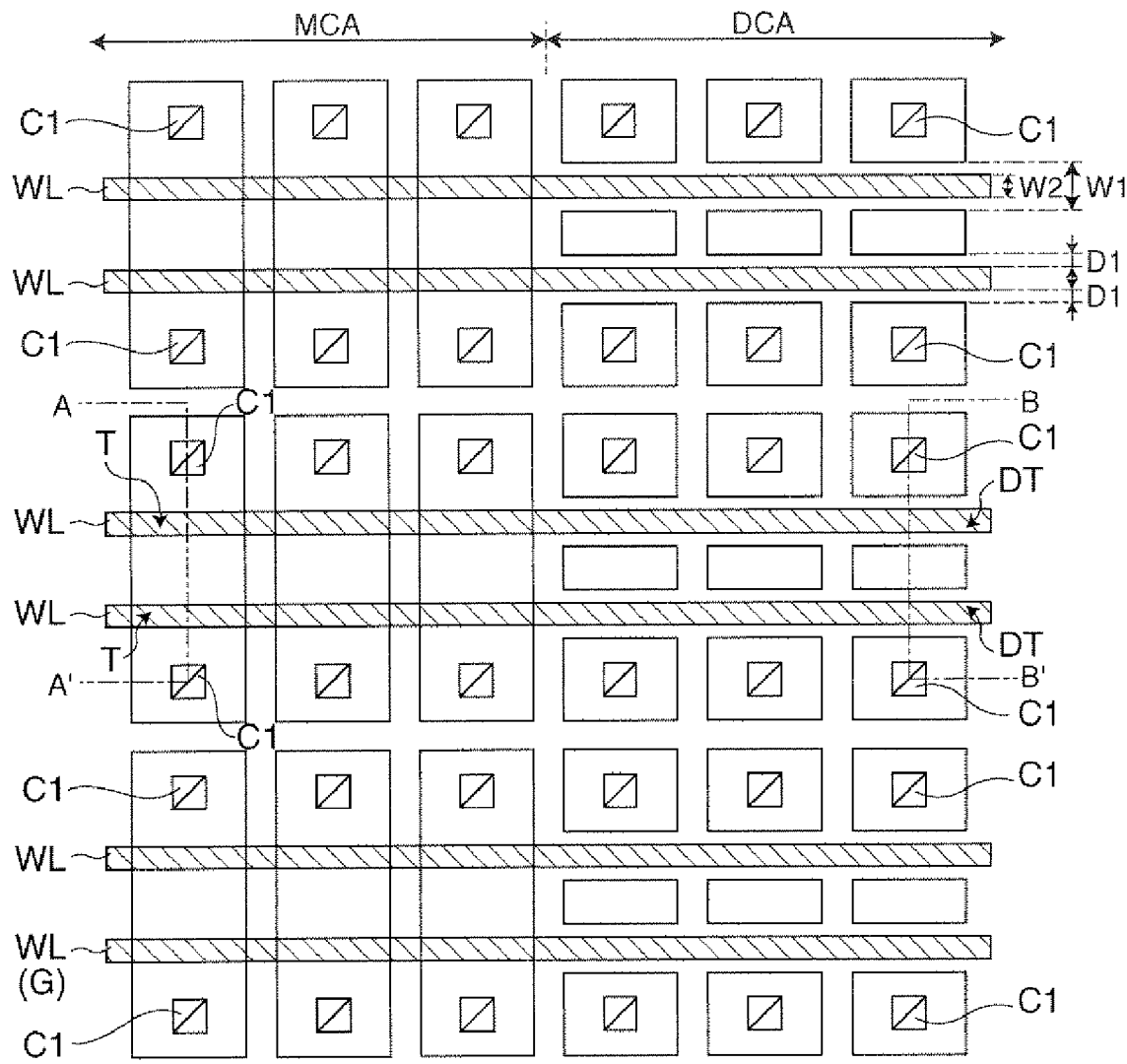
FIG. 6 is a plan view showing a specified portion in a step of the method for manufacturing a ferroelectric memory device in accordance with the embodiment of the invention.

Also, the width of the isolation dielectric film 3a (W1 in FIG. 5 and FIG. 6) is greater (wider) than the width of the gate electrode G (W2 in FIG. 5 and FIG. 6). Accordingly, the source/drain regions 7 cannot reach areas blow the end sections of the gate electrode G, such that they are separated by a predetermined distance (D1).

Other structural details of the dummy cell are generally the same as those of the memory cell, and the ferroelectric capacitor Ca is composed of the lower electrode LE, the ferroelectric film fe and the upper electrode UE.

One of the source and drain regions 7 (one end) of the dummy transistor DT is connected to the bit line BL through a connecting section C3, a pattern P3 and a connecting section C4, provided above the dummy transistor DT. The other of the source and drain regions 7 (the other end) of the dummy transistor DT is connected to the lower electrode LE of the ferroelectric capacitor Ca through a connecting section C1 provided above the dummy transistor DT. Also, the upper electrode UE of the ferroelectric capacitor Ca is connected to the plate line PL through a connecting section C2 provided above the ferroelectric capacitor Ca.

The structure of each portion of the ferroelectric memory device in accordance with the present embodiment is described in conjunction with a method for manufacturing the ferroelectric memory device to be described below.

Figure 3:
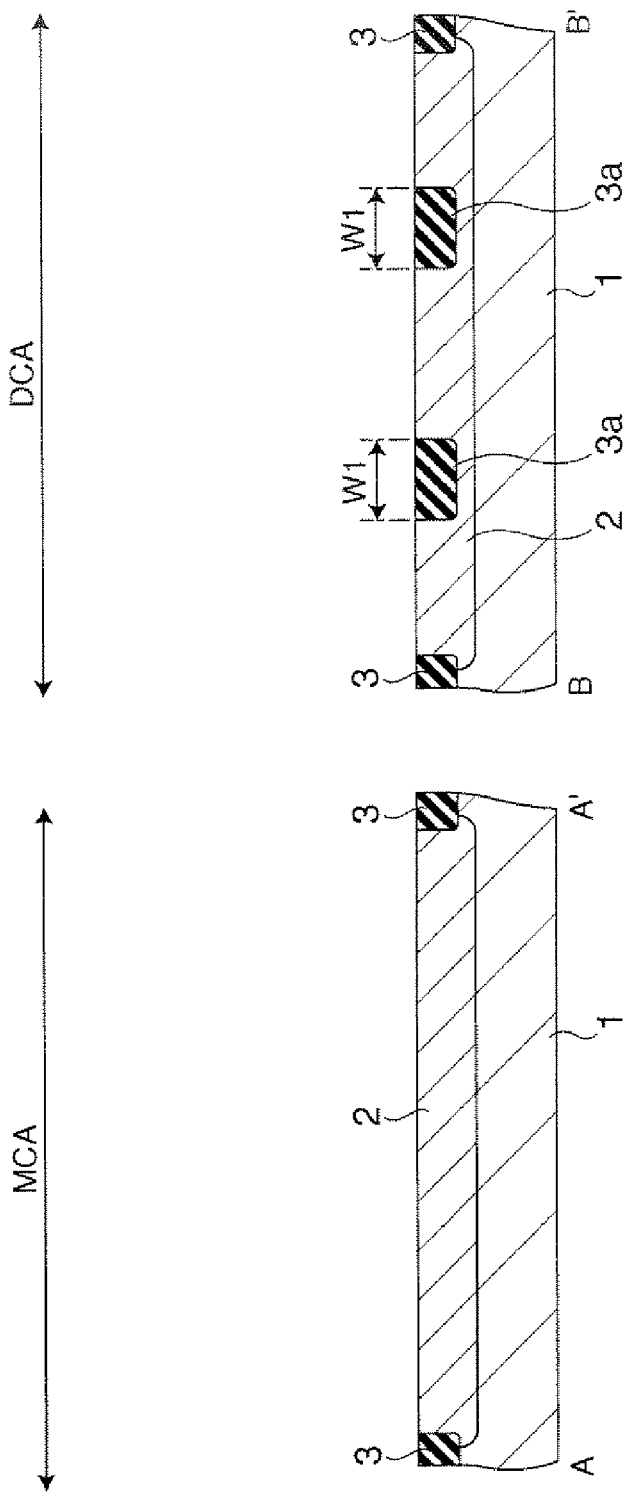
FIG. 3 is a cross-sectional view showing a step of a method for manufacturing a ferroelectric memory device in accordance with an embodiment of the invention.
Figure 4:
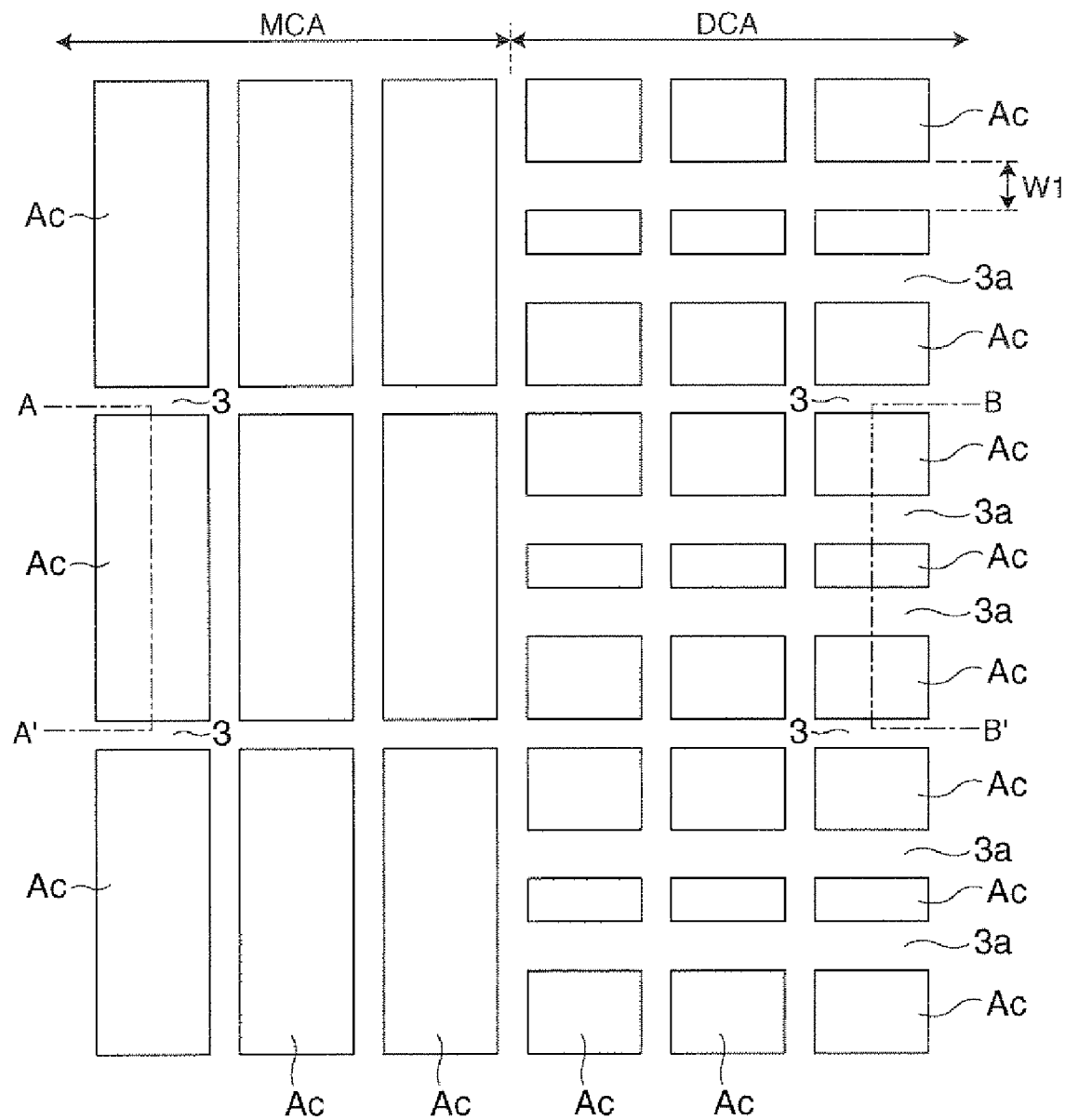
FIG. 4 is a plan view showing a specified portion in a step of the method for manufacturing a ferroelectric memory device in accordance with the embodiment of the invention.

As shown in FIG. 3 and FIG. 4, a substrate 1, such as, for example, a silicon substrate, is prepared, and element forming regions Ac are formed on a main surface of the substrate 1 (FIG. 4). The element forming regions Ac are defined by an element isolation dielectric film 3. For example, the element isolation dielectric film 3 may be formed as follows. First, the substrate 1 is etched in areas other than the element forming regions Ac to form isolation grooves, and then a dielectric film, such as, for example, a silicon oxide film is deposited on the substrate 1 including inner areas of the isolation grooves by a CVD (chemical vapor deposition) method. Then, by using an etching back method or a CMP (chemical mechanical polishing) method, portions of the silicon oxide film are removed until the surface of the substrate 1 is exposed. As a result, as shown in FIG. 4, the element forming regions Ac each being in a generally rectangular shape are defined by the element isolation dielectric film 3.

In the dummy cell area DCA, another dielectric film (an isolation dielectric film) 3a that divides each of the generally rectangular element forming regions Ac is formed. The dielectric film 3a is formed below a gate electrode (a word line WL) G to be described below, and the width (W1) of the dielectric film 3a is greater than the width (W2) of the gate electrode G (see FIG. 5 and FIG. 6). Then, by injecting (implanting) p-type impurity, p-type wells 2 are formed.

Then, as shown in FIG. 5 and FIG. 6, transistors T, dummy transistors DT and connecting sections C1 are formed. First, for example, a gate dielectric film 5, such as, an oxide film is formed on the substrate 1 by using a thermal oxidation method, a CVD method or the like. Then, a semiconductor film, such as, for example, a silicon oxide film is deposited on the oxide film by a CVD method.

Then, a photoresist film (hereafter simply referred to as a "resist film") is formed, and the resist film is subjected to exposure and development (photolithography), whereby the resist film (i.e., a mask film, a resist mask) is remained in lines. By using the resist film as a mask, the semiconductor film is etched to form gate electrodes G (word lines WL) extending in lines in the first direction (see FIG. 6). Then, the resist film is removed by, for example, ashing. It is noted that a series of the steps of forming a resist film, conducting photolithography, etching and removing the resist film is hereafter referred to as patterning.

Here, in the dummy cell area DCA, gate electrodes G (word lines WL) are formed on the isolation dielectric film 3a. As described above, the width (W2) of the gate electrode G is smaller than the width (W1) of the isolation dielectric film 3a.

Then, by injecting (implanting) n-type impurity such as phosphorus in areas on both sides of the gate electrodes G, source/drain regions 7 are formed. One of the source/drain regions 7 on the sides of the gate G defines a source region, and the other defines a drain region.

It is noted that, in the dummy cell area DAC, because the isolation dielectric film 3a extends in the areas in the substrate on both sides of the gate electrode G, source/drain regions (diffusion layers) 7 are not formed in those areas, and offset structures are formed, as shown in FIG. 5. In other words, the end sections of the gate electrode G and end sections of the source/drain regions 7 on the side of the gate electrode G are separated from one another by a distance D1.

In this manner, in the dummy cell area DCA, 1) the isolation dielectric film 3a is present below the gate electrode G, and 2) the end sections of the gate electrode G are separated from the end sections of the source/drain regions (diffusion layers) 7. Therefore, the dummy transistor DT has a pseudo transistor structure (i.e., a structure similar to that of a transistor of a memory cell), and cannot function as a transistor.

Then, an interlayer dielectric film 9, such as, for example, a silicon oxide film is formed over the transistors T and the dummy transistors DT by a CVD method, and the interlayer dielectric film 9 is then patterned, whereby contact holes are formed over ones of the source/drain regions (diffusion layers) 7. Then, a conductive film is embedded in the contact holes, thereby forming connecting sections C1.

For example, a conductive film is deposited on the interlayer dielectric film 9 including inner surfaces of the contact holes, and an upper portion of the conductive film may be etched back, or polished by CMP until the surface of the interlayer dielectric film 9 is exposed, whereby the connecting sections C1 are formed.

When the connecting sections C1 are formed by using a CMP method, a so-called dishing phenomenon may become a problem. This is a phenomenon in which the polishing amount differs from one portion to another on the substrate 1. For example, a central area of the substrate 1 tends to have a greater amount of polishing, and a peripheral area of the substrate 1 tends to have a smaller amount of polishing. Also, an area where the pattern density is high (i.e., patterns are concentrated) tends to have a smaller amount of polishing, and an area where the pattern density is low (i.e., patterns are dispersed) tends to have a greater amount of polishing.

Accordingly, depending on the locations where the connecting sections C1 are formed, the height of the connecting sections C1 may differ from one place to another. FIG. 5 shows a case in which, in the dummy cell area DCA, the connecting sections C1 on the right-hand side of the figure are formed relatively lower. Compared to the memory area MA (including the memory cell array MCA and the dummy cell area DCA) where the connecting sections C1 are regularly arranged at short pitches, the pattern pitch in the peripheral circuit area PA is loosened (see FIG. 1). Accordingly, the amount of polishing is smaller in the memory area MA, and the amount of polishing is greater in the peripheral circuit area PA. Accordingly, the dummy cell area DCA, which is located in a border area between the memory cell array MCA and the peripheral circuit area PA, is affected by the peripheral circuit area PA, such that the amount of polishing of the dummy cell area DCA becomes greater. As a result, the height of the connecting sections C1 in the dummy cell area DCA may become lower than those in the memory cell area.

It is noted that, in this example, the case where the height of the connecting sections C1 in the dummy cell area becomes lower is described, but the height thereof may become higher in some cases. The process using a CMP method has so far been described as an example, but similar problems may occur in the case of the process using an etching back method. Also, in the film forming and patterning steps, deformations in the formed films and patterns would likely occur due to the aforementioned differences in pattern pitch at the border between the memory cell array MCA and the peripheral circuit area PA.

However, in accordance with the present embodiment, the connecting sections C1 are also formed in the dummy cell area DCA (in the dummy cells), such that the configuration of the connecting sections C1 in the memory cell array MCA (of the memory cells) is secured. In other words, even when differences in the height of the connecting sections C1 occur, such differences can be terminated within the dummy cell area DCA, and differences in the height (deviations in the height) of the connecting sections C1 in the memory cell array MCA can be reduced. In other words, even when some of the connecting sections C1 are formed lower, as shown in FIG. 5, such defects occur within the dummy cell area DCA, and the configuration of the connecting sections C1 in the memory cell array MCA can be maintained.

Figure 8:
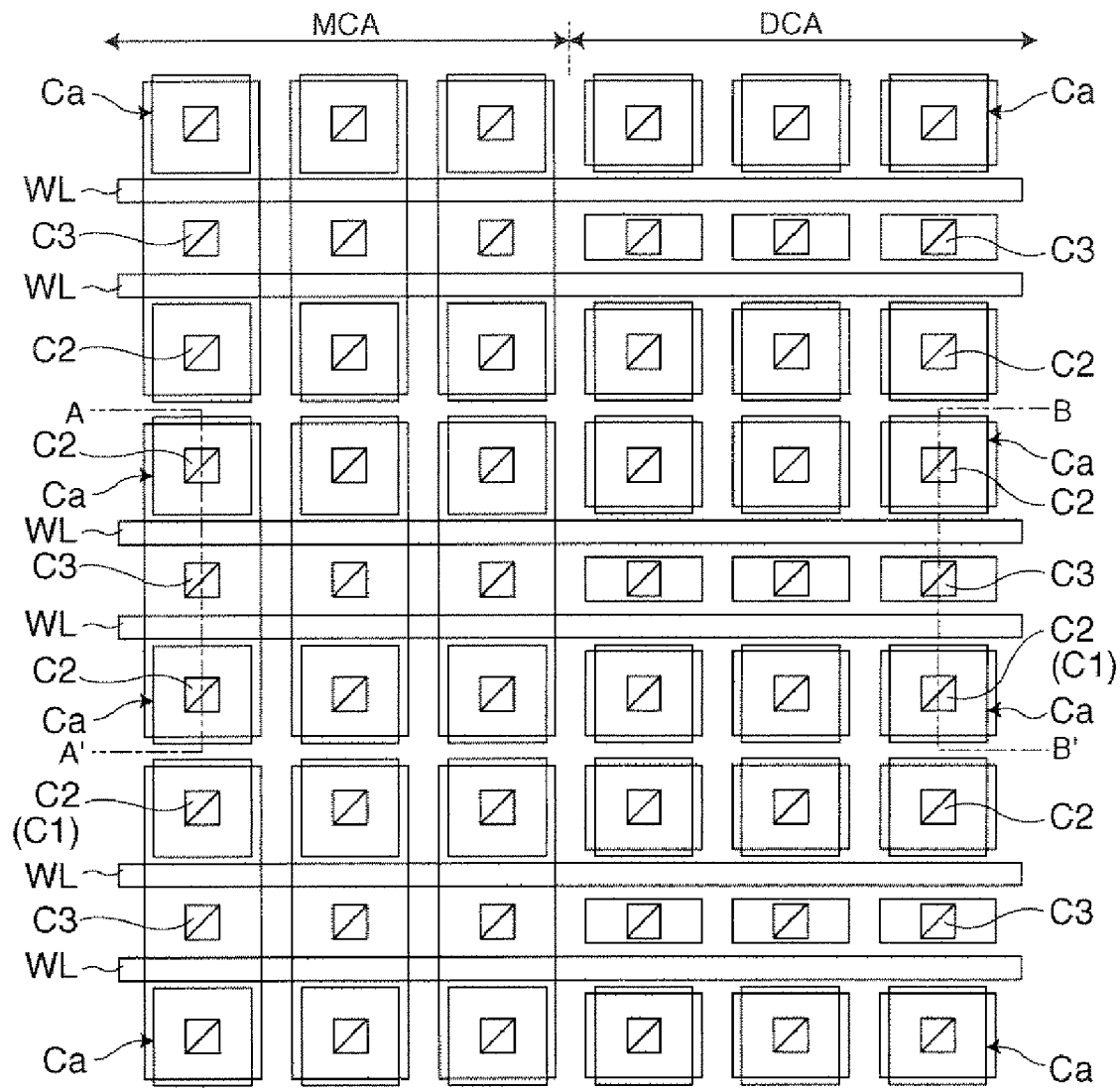
FIG. 8 is a plan view showing a specified portion in a step of the method for manufacturing a ferroelectric memory device in accordance with the embodiment of the invention.

Then, as shown in FIG. 8 and FIG. 9, ferroelectric capacitors Ca are formed above the connecting sections C1. First, a conductive film that becomes to be lower electrodes LE is deposited on the interlayer dielectric film 9 including the connecting sections C1, and then a ferroelectric film fe is deposited on the conductive film. Further, a conductive film that becomes to be upper electrodes UE is formed on the ferroelectric film fe. The deposited films are patterned, thereby forming ferroelectric capacitors Ca.

Because the ferroelectric capacitors Ca are also formed in the dummy cell area DCA, the configuration of the ferroelectric capacitors in the memory cell array MCA can be secured.

Also, as described above, even if differences in the height of the connecting sections C1 occur, such differences occur within the dummy cell area DCA, and differences in the height of the connecting sections C1 in the memory cell array MCA can be reduced. Therefore, the flatness of the ferroelectric capacitors Ca (the lower electrodes Le, the ferroelectric film fe, and the upper electrodes UE) formed above the connecting sections C1 can be secured. In particular, step differences that may be caused by the connecting sections C1 of the ferroelectric films fe can be reduced.

Figure 7:
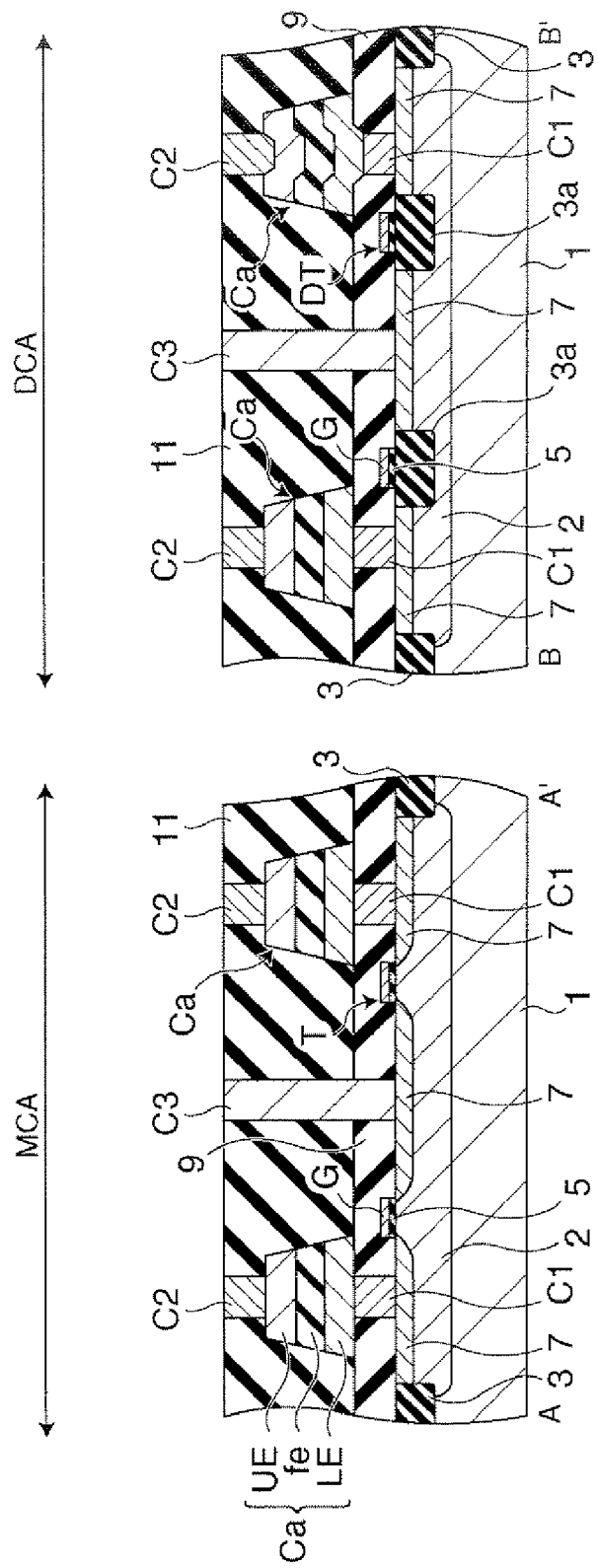
FIG. 7 is a cross-sectional view showing a step of the method for manufacturing a ferroelectric memory device in accordance with the embodiment of the invention.

For example, as shown in FIG. 7, when the connecting section 1 in the dummy cell area DCA on the right hand side of the figure is formed lower, a step difference occurs in the ferroelectric capacitor Ca, in particular, in the ferroelectric film fe.

It is noted that, in a ferroelectric memory device, the orientation of its ferroelectric film greatly influences its memory characteristics. Therefore, in order to improve the memory characteristics, it is important to improve the orientation of the film, in other words, it is important to orient molecules composing the film in the same direction.

Accordingly, if the aforementioned step differences occur in the memory cell array MCA, the orientation of molecules of each composition composing the ferroelectric film is disturbed at the step differences, and the memory characteristics deteriorate.

In contrast, in accordance with the present embodiment, height differences in the connecting sections C1 in the memory cell array MCA can be reduced, and the fatness of the ferroelectric films fe formed above the connecting sections C1 can be improved, such that the memory characteristics (read-out and writing characteristics) of the device can be improved.

Also, as described above, because the end sections of the gate electrode G and the end sections of the source/drain regions 7 are separated from each other by a distance D1 in the dummy cell area DCA, a floating state occurs at these portions (separated sections) even when a potential is applied to the plate line PL and the bit line BL, and therefore the capacitor capacitance would not be loaded on the plate line P1. Also, the load on the bit line BL can be reduced. Accordingly, a high speed operation can be achieved.

Also, even when a potential is applied to the word line WL, the dummy transistor DT in the dummy cell area DCA does not turn on, such that the load on the word line WL can also be reduced. Accordingly, a high speed operation can be achieved.

Then, an interlayer dielectric film 11, such as, for example, a silicon oxide film is formed over the ferroelectric capacitors Ca by a CVD method, and the interlayer dielectric film 11 on the upper electrodes UE is patterned to form contact holes, and a conductive film is embedded in the contact holes, thereby forming connecting sections C2. In this instance, connecting sections C3 are also formed on the source/drain regions (diffusion layers) 7 of the transistors T and the dummy transistors DT. These connecting sections C2 and C3 can be formed in a similar manner as the connecting sections C1. As the connecting sections C2 and C3 are also formed in the dummy cell area DCA, the configuration of the connecting sections C2 and C3 in the memory cell area can be secured.

Next, as show in FIG. 9 and FIG. 10, a conductive film is formed over the interlayer dielectric film 11 including over the connecting sections C2, and the conductive film is patterned in the form of lines extending on the connecting sections C2 in the first direction, thereby forming plate lines PL. In this instance, patterns P3, each having a generally rectangular shape, are also formed on the connecting sections C3. In this manner, the patterns P3 are also formed in the dummy cell area DCA, such that the configuration of the patterns P3 in the memory cell area can be secured.

Then, an interlayer dielectric film 13, such as, for example, a silicon oxide film is formed over the plate lines PL by a CVD method, the interlayer dielectric film 13 over the patterns P3 (connection sections C3) is patterned to form contact holes, and a conductive film is embedded in the contact holes, thereby forming connecting sections C4. The connecting sections C4 can be formed in a similar manner as the connecting sections C1. In this manner, the connecting sections C4 are also formed in the dummy cell area DCA, such that the configuration of the connecting sections C4 in the memory cell area can be secured.

Then, a conductive film is deposited over the interlayer dielectric film 13 including over the connecting sections C4, and the interlayer dielectric film 13 is patterned in lines extending on the connecting sections C4 in the second direction, thereby forming bit lines BL.

Then, insulation films and wirings (not illustrated) are formed over the bit lines BL, whereby the ferroelectric memory device in accordance with the present embodiment is generally completed.

In this manner, in accordance with the present embodiment, although the connecting sections are formed above and below the ferroelectric capacitors composing the dummy cells, the dummy transistors are formed to have the structure described above, such that loads on the plate lines, the bit lines and the word lines can be reduced, and the operation speed can be improved.

Also, in accordance with the present embodiment, the connecting sections are formed above and below (in particular immediately below) the ferroelectric capacitors composing the dummy cells, the configuration of the corresponding memory cells can be maintained. As a result, the flatness of the ferroelectric film can be secured, and the memory characteristics can be improved.

It is noted that, in accordance with the present embodiment, the element isolation dielectric film 3 and the isolation dielectric film 3a are provided with a so-called trench structure, but they can be formed with LOCOS oxidation films (isolation).

Furthermore, the embodiment of the invention is applicable not only to ferroelectric memory devices of a 2T2C type, but also to ferroelectric memory devices of a 1T1C type.

Other Exemplary Structures

FIGS. 11 through 15 are cross-sectional views showing structures of ferroelectric memory devices in accordance with other embodiments of the invention. The structures and other features of the ferroelectric memory devices in accordance with the other embodiments are described below with reference to the accompanying drawings. The same components as those in the above-described embodiment are appended with the same or similar reference numbers, and description of the same components is not repeated.

Figure 11:
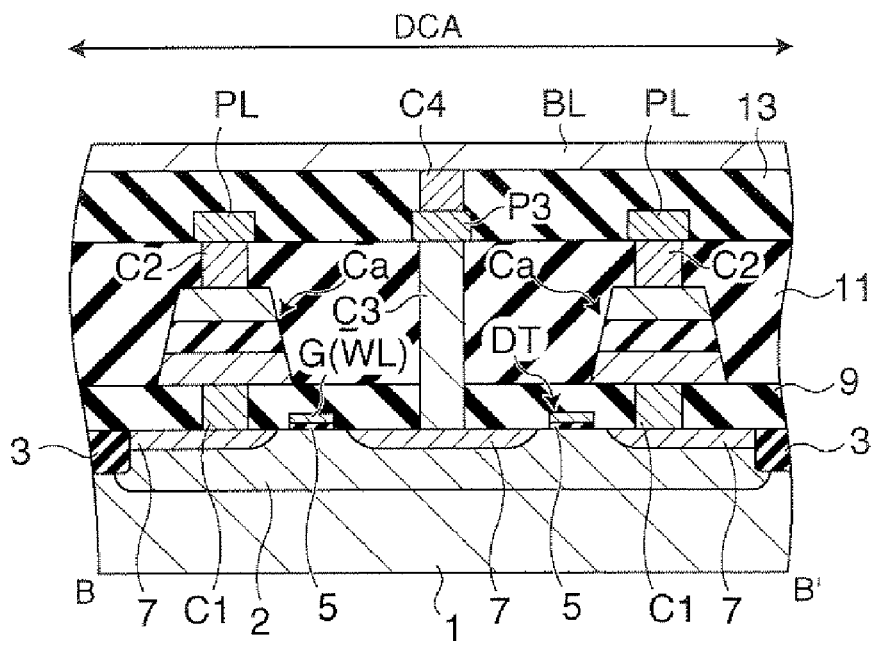
FIG. 11 is a cross-sectional view showing a structure of a ferroelectric memory device in accordance with another embodiment of the invention.

(1) In the embodiment described above, the isolation dielectric films 3a are formed below the gate electrodes G in the dummy cell area DCA, and the end sections of the gate electrodes G are separated from the end sections of the corresponding source/drain regions (diffusion layers) 7. However, as shown in FIG. 11, it is possible to provide a structure in which an isolation dielectric film 3a may not be formed below the gate electrode G, and simply, the end sections of the source/drain regions (diffusion layers) 7 may be separated from the end sections of the gate G. It is noted that reference numeral 5 denotes a gate dielectric film, and other parts of the structure are the same as those of the ferroelectric memory device described above with reference to FIGS. 3 through 10, and therefore their detailed description is omitted.

The structure in which the source/drain regions (diffusion layers) are separated from the end sections of the gate electrode G by a distance (D1) may be formed as follows. For example, prior to injecting (implanting) n-type impurity such as phosphorous in areas on both sides of the gate electrode G, a resist film having a width W1 is formed on the gate electrode G in the dummy cell area DCA, and n-type impurity is injected by using the resist film as a mask. Other details of the manufacturing process are the same as those applied for the ferroelectric memory device described above with reference to FIGS. 3 through 10, and therefore their detailed description is omitted.

Figure 12:
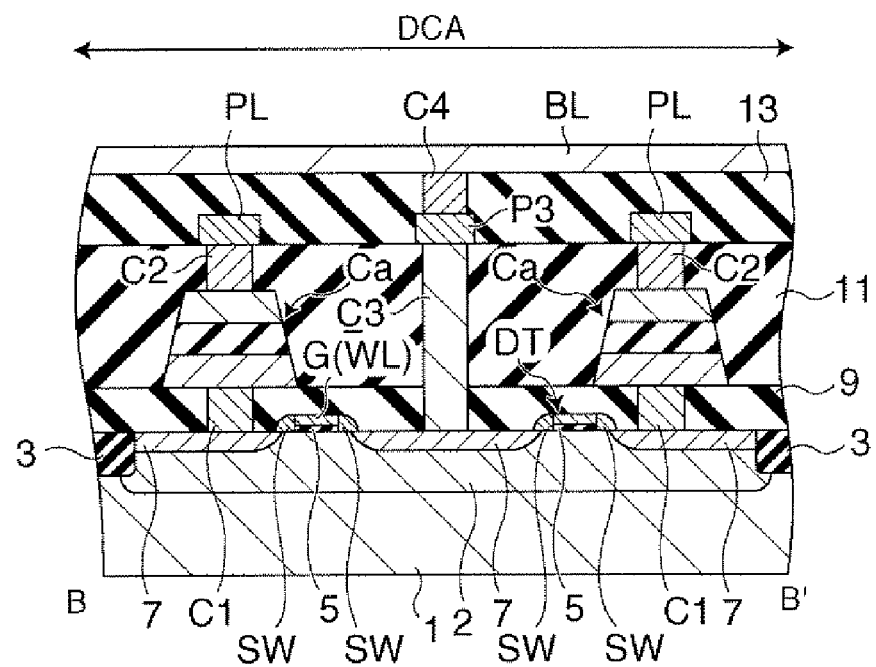
FIG. 12 is a cross-sectional view showing a structure of a ferroelectric memory device in accordance with another embodiment of the invention.

(2) Also, as shown in FIG. 12, sidewall films SW may be formed on side walls of the gate electrode G, and n-type impurity such as phosphorous may be injected by using the sidewall films SW as a mask. For example, in the peripheral circuit area PA, transistors composing the peripheral circuit are formed. These transistors may often be provided with a LDD (lightly doped drain) structure to realize short channels.

For example, impurity may be injected by using gate electrodes of the transistors composing the peripheral circuit as a mask, which are formed in the same manner as the gate electrodes of the memory cells, thereby forming low concentration impurity regions. Then, sidewalls are formed, and impurity is injected by using the sidewalls as a mask to form high concentration impurity regions, whereby transistors with an LDD structure can be formed. The sidewalls may be formed through, for example, forming a dielectric film on the gate electrodes by, for example, a CVD method, and then anisotropically etching the dielectric film.

Accordingly, at the time of forming the sidewalls described above, sidewalls SW are also formed at gate electrodes G in the dummy cell area DCA, and then, the high concentration impurity regions and source/drain regions 7 of the memory cells are formed. It is noted that other details of the structure and the manufacturing process are the same as those applied to the ferroelectric memory device described with reference to FIGS. 3 through 10, and therefore their detailed description is omitted.

Figure 13:
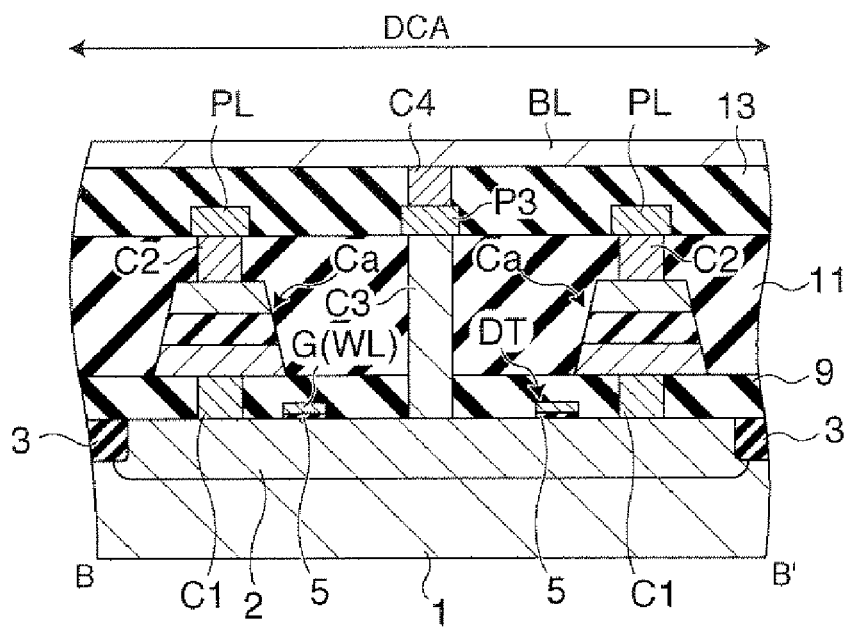
FIG. 13 is a cross-sectional view showing a structure of a ferroelectric memory device in accordance with another embodiment of the invention.

(3) Also, as shown in FIG. 13, it is possible to provide a structure in which source/drain regions (diffusion layers) 7 are not formed in the dummy cell area DCA. It is noted that other details of the structure are the same as those of the ferroelectric memory device described with reference to FIGS. 3 through 10, and therefore their detailed description is omitted.

More concretely, prior to injecting (implanting) n-type impurity for forming source/drain regions (diffusion layers) 7, the dummy cell area DCA may be covered by a resist layer, and n-type impurity is injected by using the resist layer as a mask. It is noted that other details of the manufacturing process are the same as those applied to the ferroelectric memory device described with reference to FIGS. 3 through 10, and therefore their detailed description is omitted.

However, it may be more preferable to form source/drain regions (diffusion layers) 7, because diode connections in a reverse direction are formed between the source/drain regions (diffusion layers) 7 and the p-type well 2, and therefore the electrical insulation property is enhanced.

Also, the end sections of the gate G are separated from the source/drain regions (diffusion layers) 7 in the dummy cell area DCA, in the embodiment described above, and in the other exemplary embodiments (1) and (2). However, only one of the source and drain regions 7 may be separated form one of the end sections of the gate electrode G. Also, in the exemplary embodiment (3) described above, it is possible to provide a structure in which only one of the source and drain regions (diffusion layers) 7 is not formed in the dummy cell area DCA.

Figure 14:
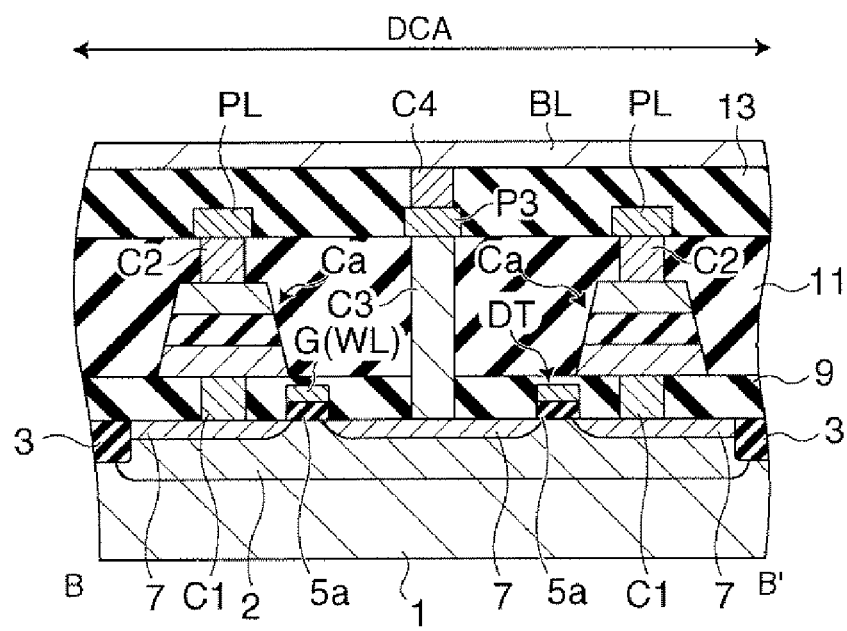
FIG. 14 is a cross-sectional view showing a structure of a ferroelectric memory device in accordance with another embodiment of the invention.

(4) In the embodiment described above, the isolation dielectric film 3a is formed below the gate electrode G in the dummy cell area DCA. However, as shown in FIG. 14, an isolation dielectric film 3a may not be formed below the gate electrode G, and the film thickness of a gate dielectric film 5a in the dummy cell area DCA may be made greater (than that of the gate dielectric film 5 of the memory cell). As a result, the dummy transistors DT are provided with a structure that does not turn on. In this case, for example, the gate dielectric films 5a with a predetermined film thickness are formed in the dummy cell area DCA by using a CVD method or the like. It is noted that other details of the structure and the manufacturing process are the same as those applied to the ferroelectric memory device described with reference to FIGS. 3 through 10, and therefore their detailed description is omitted.

In this manner, any of the components of transistors, such as, gate electrodes, gate dielectric films, source and drain regions may not be provided, or may be deformed, whereby the dummy transistors are provided with a structure that does not turn on, in other words, a structure that does not become conductively connected with other components. As a result, portions that disconnect electrical connections between the plate lines and the bit lines are generated, such that the load on these wirings can be alleviated. Also, even when a potential is applied to the word lines, the driving transistors do not turn on, and therefore the load on the word lines can be alleviated.

(5) Also, as shown in FIG. 15, there can be provided a structure in which, in the dummy cell area DCA, any of the connecting sections C3 and C4, and the pattern P3 that connect the bit lines BL and the source/drain regions (diffusion layers) 7 of the driving transistors may not be formed.

Figure 15A:
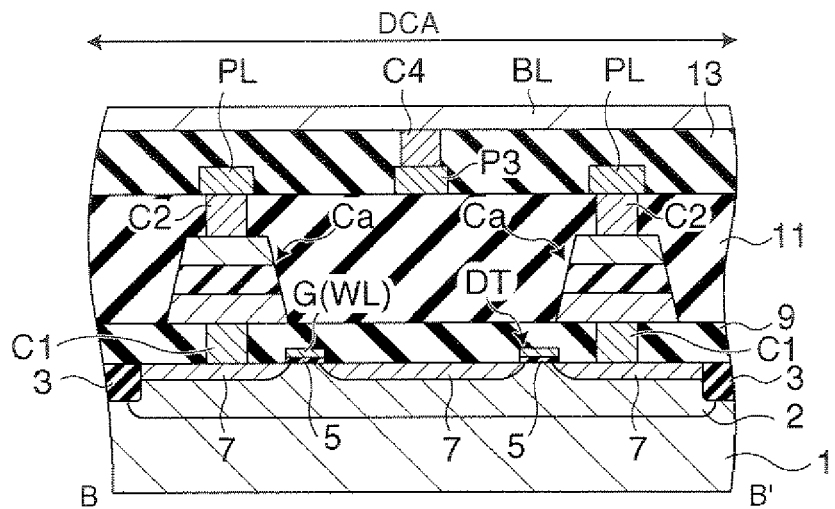
FIG. 15 is a cross-sectional view showing a structure of a ferroelectric memory device in accordance with another embodiment of the invention.
Figure 15B:
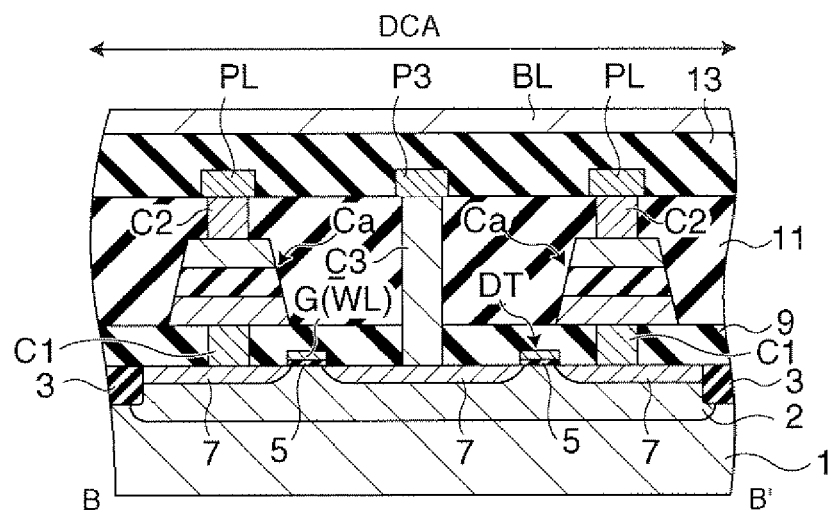
Figure 15C:
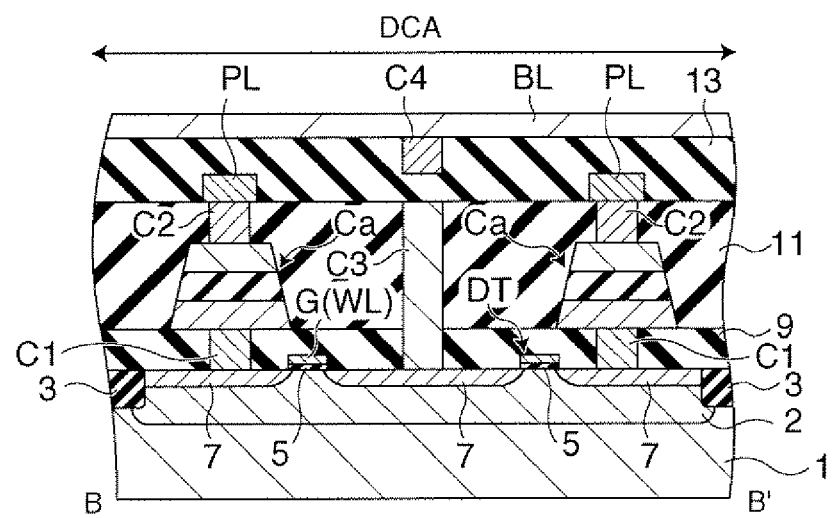

FIG. 15A shows a structure in which the connecting sections C3 are not formed, FIG. 15B shows a structure in which the connecting sections C4 are not formed, and FIG. 15C shows a structure in which the patterns P3 are not formed. It is noted that other details of the structure and the manufacturing process are the same as those applied for the ferroelectric memory device described with reference to FIGS. 3 through 10, and therefore their detailed description is omitted.

In this manner, by providing portions that disconnect the electrical connections between the bit lines BL and the source/drain regions (diffusion layers) 7 of the driving transistors DT, the load on the bit lines and the plate lines can be alleviated. However, in this case, when a potential is applied to the word lines WL, the driving transistors DT turn on.

It is noted that the exemplary embodiments (1) through (5) described above, including the structure of the embodiment described above, can be appropriately combined with one another.

In this manner, in accordance with the present embodiment, a variety of modified examples may be available. However, the method using isolation dielectric films 3a described with reference to FIG. 9 may be more effective, as its structure and manufacturing method are relatively simple.

More specifically, at the time of forming element isolation areas in an initial stage of the manufacturing process, it only needs to form an isolation dielectric film 3a, and source/drain regions 7 shall be formed separated in a self alignment manner in steps to be conducted later. Accordingly, the devices can be readily formed without increasing the number of manufacturing steps and resist masks.

Also, in accordance with the present embodiment, by forming the isolation dielectric films 3a below the gate electrodes G in the dummy cell area DCA, and separating the end sections of the gate electrodes G from the end sections of the source/drain regions (diffusion layers) 7, the driving transistors are made in a state that is not fully functional.

Also, in accordance with the present embodiment, the dummy cells (dummy cell area) are formed in an outer circumference area of the memory cell array (see FIG. 1). However, the dummy cells may be provided inside the memory cell array, or the dummy cells may be provided among the memory cells.

Figure 16:
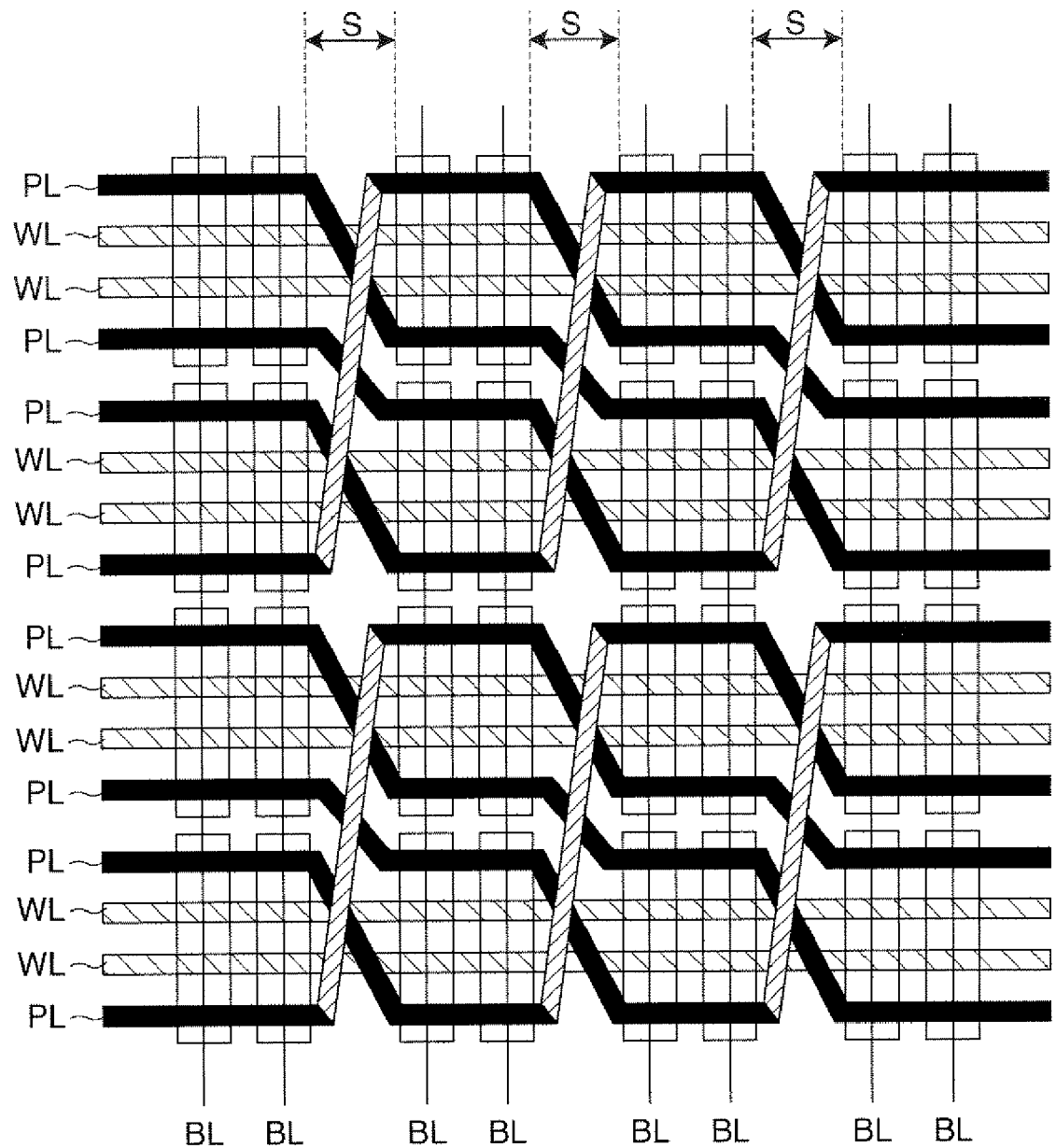
FIG. 16 is a cross-sectional view showing a structure of a ferroelectric memory device in accordance with another embodiment of the invention.

FIG. 16 is a plan view showing a structure of a ferroelectric memory device in accordance with still another embodiment of the invention. As shown in FIG. 16, memory cells MC are disposed in an array configuration, and spaces S are provided among the memory cells. Also, word lines extend in a first direction, and bit lines BL extend in a second direction perpendicular to the first direction. It is noted that, as shown in FIG. 16, plate lines PL are disposed (shifted) stepwise, and folded, using the regions of the spaces S, and using other wiring layers. In this case, the wirings in a stepwise fashion, and the folding wirings are formed in different layers.

As the wirings (for example, the folding wirings described above) are formed in this manner, when the spaces S (for connection of the memory cells) are provided among the memory cells, the regularity of the arrangement of the components of the memory cells cannot be maintained. Therefore, dummy cells (driving transistors DT, ferroelectric capacitors Ca and connecting sections C1, etc.) in accordance with the embodiment of the invention may be provided in the space S, to secure the regular arrangement of the components of the memory cells, and to secure the configuration of the memory cells. It is noted that illustration of the dummy cells is omitted in FIG. 16. In addition to the folding wirings described above, the spaces S among the memory cells may also be used as forming regions for forming so-called backing wirings to reduce the resistance of the word lines WL.

In this manner, when gaps (spaces) each having a greater width than a memory cell are formed among memory cells, dummy cells may be provided in the gaps.

What is claimed is:

1. A ferroelectric memory device comprising:
a memory cell having a transistor and a ferroelectric capacitor connected in series between a bit line and a plate line, and a connecting section below the ferroelectric capacitor;
a dummy cell having a transistor, a ferroelectric capacitor and a connecting section, the dummy cell having an electrically disconnected section among the bit line, the transistor, the ferroelectric capacitor, the connecting section and the plate line, and the transistor of the dummy cell having a gate electrode, an isolation dielectric film formed below the gate electrode, and a source/drain region formed on each side of the gate electrode, a width of the isolation dielectric film being greater than a width of the gate electrode such that an end section of the gate electrode is separated from an end section of the source/drain region by a distance corresponding to a difference between the width of the isolation dielectric film and the width of the gate electrode.

2. A ferroelectric memory device comprising:
a first cell; and
a second cell, each of the first cell and the second cell having:
a gate electrode formed on a substrate;
first and second diffusion layers formed in the substrate on both sides of the gate electrode;
a connecting section formed on the first diffusion layer; and
a ferroelectric capacitor formed on the connecting section,
the second cell having an isolation dielectric film formed below the gate electrode of the second cell, a width of the isolation dielectric film being greater than a width of the gate electrode of the second cell;
wherein the gate electrode of the second cell is separated from an end section of the first diffusion layer of the second cell located adjacent to the gate electrode of the second cell by a distance corresponding to a difference between the width of the isolation dielectric film and the width of the gate electrode of the second cell.

3. A ferroelectric memory device according to claim 2, wherein the gate electrode is separated from an end section of the second diffusion layer located adjacent to the gate electrode.

4. A ferroelectric memory device according to claim 2, comprising another connecting section provided above the ferroelectric capacitor.

5. A ferroelectric memory device according to claim 2, wherein the first cell and the second cell are formed in a memory region, wherein the second cell is located more outside than the first cell.

6. A ferroelectric memory device according to claim 2, wherein a plurality of the first cells are disposed in an array, and the second cell is disposed in an outer circumference of the plurality of the first cells arranged in an array, or among the plurality of the first cells.

7. An electric apparatus comprising:
a ferroelectric memory device, wherein the ferroelectric memory device includes: a memory cell having a transistor and a ferroelectric capacitor connected in series between a bit line and a plate line, and a connecting section below the ferroelectric capacitor; a dummy cell having a transistor, a ferroelectric capacitor and a connecting section, wherein the dummy cell has an electrically disconnected section among the bit line, the transistor, the ferroelectric capacitor, the connecting section and the plate line, and the transistor of the dummy cell having a gate electrode, an isolation dielectric film formed below the gate electrode, and a source/drain region formed on each side of the gate electrode, a width of the isolation dielectric film being greater than a width of the gate electrode such that an end section of the gate electrode is separated from an end section of the source/drain region by a distance corresponding to a difference between the width of the isolation dielectric film and the width of the gate electrode.

* * * * *